United States Patent
Nakao

(10) Patent No.: US 8,102,051 B2
(45) Date of Patent: Jan. 24, 2012

(54) SEMICONDUCTOR DEVICE HAVING AN ELECTRODE AND METHOD FOR MANUFACTURING THE SAME

(75) Inventor: Yuichi Nakao, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/452,235

(22) PCT Filed: Jun. 20, 2008

(86) PCT No.: PCT/JP2008/061347
§ 371 (c)(1), (2), (4) Date: Dec. 22, 2009

(87) PCT Pub. No.: WO2009/001780
PCT Pub. Date: Dec. 31, 2008

(65) Prior Publication Data
US 2010/0117232 A1    May 13, 2010

(30) Foreign Application Priority Data

Jun. 22, 2007 (JP) .................... 2007-165540
Jun. 22, 2007 (JP) .................... 2007-165541

(51) Int. Cl.
*H01L 23/48* (2006.01)
*H01L 21/768* (2006.01)

(52) U.S. Cl. ......... 257/751; 257/E21.584; 257/E23.011; 257/E23.141; 257/E23.161; 257/774; 257/773; 257/761

(58) Field of Classification Search .............. 257/751, 257/E21.584, E23.011, 761, E23.141, E23.161, 257/774, 773
See application file for complete search history.

(56) References Cited

U.S. PATENT DOCUMENTS

| | | | |
|---|---|---|---|
| 5,670,808 A | 9/1997 | Nishihori et al. | |
| 5,929,473 A | 7/1999 | Nishihori et al. | |
| 6,573,604 B1 | 6/2003 | Kajita | |
| 6,700,147 B1 | 3/2004 | Saigoh | |
| 7,413,977 B2 * | 8/2008 | Shimizu et al. | 438/637 |
| 7,795,733 B2 * | 9/2010 | Tsumura et al. | 257/758 |
| 7,827,222 B2 * | 11/2010 | Liardet et al. | 708/250 |
| 2004/0043518 A1 | 3/2004 | Saigoh | |
| 2005/0218519 A1 | 10/2005 | Koike et al. | |
| 2007/0012973 A1 * | 1/2007 | Nasu et al. | 257/295 |
| 2007/0173055 A1 * | 7/2007 | Ohtsuka et al. | 438/627 |

(Continued)

FOREIGN PATENT DOCUMENTS

JP        8-274256 A    10/1996

(Continued)

*Primary Examiner* — A O Williams
(74) *Attorney, Agent, or Firm* — Robin & Berdo, PC

(57) ABSTRACT

The semiconductor device according to the present invention includes a first insulating layer made of a material containing Si and O, a groove shaped by digging down the first insulating layer, an embedded body, embedded in the groove, made of a metallic material mainly composed of Cu, a second insulating layer, stacked on the first insulating layer and the embedded body, made of a material containing Si and O, and a barrier film, formed between the embedded body and each of the first insulating layer and the second insulating layer, made of $Mn_xSi_yO_z$ (x, y and z: numbers greater than zero).

6 Claims, 13 Drawing Sheets

U.S. PATENT DOCUMENTS

| | | | |
|---|---|---|---|
| 2008/0054466 A1* | 3/2008 | Nasu et al. | 257/751 |
| 2008/0057704 A1 | 3/2008 | Koike et al. | |
| 2008/0146015 A1* | 6/2008 | Usui et al. | 438/608 |
| 2008/0290517 A1* | 11/2008 | Kageyama | 257/751 |
| 2008/0296772 A1* | 12/2008 | Nakao et al. | 257/761 |
| 2010/0099254 A1* | 4/2010 | Narushima et al. | 438/668 |
| 2010/0233876 A1* | 9/2010 | Matsumoto et al. | 438/652 |
| 2011/0027985 A1* | 2/2011 | Tsumura et al. | 438/619 |

FOREIGN PATENT DOCUMENTS

| | | | |
|---|---|---|---|
| JP | 2003-324185 A | | 11/2003 |
| JP | 2004-095866 A | | 3/2004 |
| JP | 2004-134498 A | | 4/2004 |
| JP | 2005-277390 A | | 10/2005 |
| JP | 2007-012923 A | | 1/2007 |
| JP | 2007-142236 A | | 6/2007 |
| JP | 2008-300674 A | * | 12/2008 |

* cited by examiner

SEMICONDUCTOR DEVICE HAVING AN ELECTRODE AND METHOD FOR MANUFACTURING THE SAME

TECHNICAL FIELD

The present invention relates to a semiconductor device and a method for manufacturing the same.

PRIOR ART

In recent years, employment of Cu (copper) having higher conductivity in place of generally employed Al (aluminum) as the material for electrodes and wires has been examined.

For example, a capacitance element (hereinafter referred to as an "MIM capacitance element") having an MIM (Metal-Insulator-Metal) structure obtained by holding a capacitance film between a lower electrode and an upper electrode is watched with interest as a capacitance element loaded on a system LSI for radio communication in particular, since the same can be improved in capacitance density due to a small resistance component. While Al is generally employed in the MIM capacitance element as the material for the lower electrode and the upper electrode, employment of Cu as the material for the lower electrode is examined for further reduction of the resistance.

FIG. 6 is a schematic sectional view of an MIM capacitance element employing Cu as the material for a lower electrode.

An MIM capacitance element 101 is formed on an unshown semiconductor substrate.

An insulating layer 102 is stacked on the semiconductor substrate. The insulating layer 102 has a structure obtained by stacking an interlayer dielectric film 103 of $SiO_2$ (silicon oxide), an etching stopper film 104 of SiC (silicon carbide) and an interlayer dielectric film 105 of $SiO_2$ in this order from the side of the semiconductor substrate.

In a surface layer portion of the insulating layer 102, a groove 106 shaped by digging down the same from the surface is formed. A lower electrode 107 of Cu is embedded in the groove 106.

Cu has higher diffusibility into $SiO_2$ as compared with Al. If the lower electrode 107 is directly in contact with the insulating layer 102, therefore, Cu may diffuse into the insulating layer 102, to cause a short circuit between electrodes or the like. Therefore, a diffusion preventing film 108 for preventing Cu from diffusing into the insulating layer 102 is formed between the insulating layer 102 and the lower electrode 107. The diffusion preventing film 108 is made of Ta (tantalum), for example.

A capacitance film 109 made of a dielectric material is stacked on the insulating layer 102 and the lower electrode 107. An upper electrode 110 of TiN (titanium nitride) is formed on the capacitance film 109. The upper electrode 110 is opposed to the lower electrode 107 through the capacitance film 109, and has a smaller outer shape than the lower electrode 107 in plan view.

An interlayer dielectric film 111 of $SiO_2$ is stacked on the capacitance film 109 and the upper electrode 110. Wires 112 and 113 are formed on the interlayer dielectric film 111 in prescribed patterns respectively.

In the interlayer dielectric film 111 and the capacitance film 109, a contact hole 114 is formed to penetrate the same in the thickness direction (the stacking direction) on a portion where the lower electrode 107 and the wire 112 are opposed to each other. A lower electrode contact plug 115 is formed in the contact hole 114. The lower electrode contact plug 115 electrically connects the wire 112 and the lower electrode 107 with each other.

In the interlayer dielectric film 111, a contact hole 116 is formed to penetrate the same in the thickness direction (the stacking direction) on a portion where the upper electrode 110 and the wire 113 are opposed to each other. An upper electrode contact plug 117 is formed in the contact hole 116. The upper electrode contact plug 117 electrically connects the wire 113 and the upper electrode 110 with each other.

Dielectric materials include SiN (silicon nitride), SiCN (silicon carbonitride), $SiO_2$ and the like. When Cu is employed as the material for the lower electrode 117, SiN or SiCN having barrier properties against diffusion of Cu is generally employed as the material for the capacitance film 109. If SiN or SiCN is employed as the material for the capacitance film 109, however, a leakage current increases as compared with a case where $SiO_2$ is employed as the material for the capacitance film 109.

Following higher integration of a semiconductor device, further refinement of wires is required. In order to suppress increase of wiring resistance, employment of Cu as the material for the wires is examined.

It is difficult to finely pattern Cu by dry etching or the like, and hence a Cu wire is formed by the so-called damascene process. In the damascene process, a fine wiring trench corresponding to a prescribed wiring pattern is first formed in an insulating film made of $SiO_2$. Then, a Cu film is formed on the insulating film by plating. The Cu film is formed with a thickness for filling up the wiring trench and covering the overall region of the surface of the insulating film. Thereafter the Cu film is polished by CMP (Chemical Mechanical Polishing). The polishing of the Cu film is continued until portions of the Cu film other than the wiring trench are entirely removed and the surface of the insulating film located outside the wiring trench is exposed. Thus, the Cu film remains only in the wiring trench, and a Cu wire embedded in the wiring trench is obtained.

Cu has higher diffusibility into $SiO_2$ as compared with Al. If the Cu wire (the Cu film) is directly formed on the insulating film made of $SiO_2$, therefore, Cu may diffuse into the insulating film to cause a short circuit between wires or the like.

Therefore, a barrier film for preventing Cu from diffusing into the insulating film is necessary between the insulating film and the Cu wire. In order to form the barrier film, a technique of forming an alloy film of an alloy of Cu and Mn (manganese) on the insulating film provided with the wiring trench in advance of formation of the Cu film and performing a heat treatment after the formation of the Cu film thereby diffusing Mn in the alloy film into the interface between the same and the insulating film and forming a barrier film made of $Mn_xSi_yO_z$ (x, y and z: numbers greater than zero; hereinafter simply referred to as "MnSiO") on the interface is proposed, for example (refer to Patent Document 2, for example).

FIG. 7 is a schematic sectional view of a multilayer interconnection structure employing a barrier film of MnSiO.

A first insulating layer 121 is stacked on an unshown semiconductor substrate. The first insulating layer 121 is formed to have a structure obtained by stacking an interlayer dielectric film 122 of $SiO_2$, an etching stopper film 123 of SiC and an interlayer dielectric film 124 of $SiO_2$ in this order from the side of the semiconductor substrate.

A fine first groove 125 corresponding to a prescribed wiring pattern is formed in a surface layer portion of the first insulating layer 121. A first wire 127 of Cu is embedded in the first groove 125 through a barrier film 126 of MnSiO.

A second insulating layer 128 is stacked on the first insulating layer 121 and the first wire 127. The second insulating layer 128 has a structure obtained by stacking a diffusion preventing film 129 of SiCN or SiN, an etching stopper film 130 of SiC, an interlayer dielectric film 131 of $SiO_2$, an etching stopper film 132 of SiC and an interlayer dielectric film 133 of $SiO_2$ in this order from the side of the first insulating layer 121.

A fine second groove 134 corresponding to a prescribed wiring pattern is formed in a surface layer portion of the second insulating layer 128. In the second insulating layer 128, a via hole 135 is penetratingly formed on a portion where the second groove 134 and the first wire 127 are opposed to each other. The inner surfaces of the second groove 134 and the via hole 135 are covered with a barrier film 136 of MnSiO. A via 137 of Cu is embedded in the via hole 135. A second wire 138 of Cu is embedded in the second groove 134.

A CuMn alloy film is formed on the inner surface of the first groove 125 formed in the first insulating layer 121, Cu serving as the material for the first wire 127 is deposited on the CuMn alloy film and a heat treatment is thereafter performed, whereby the barrier film 126 of MnSiO is formed. When the heat treatment is performed, Mn in the CuMn alloy film combines with Si (silicon) and O (oxygen) contained in the first insulating layer 121, to form MnSiO. Further, a CuMn alloy film is formed on the inner surfaces of the second groove 134 and the via hole 135 formed in the second insulating layer, Cu serving as the material for the second wire 138 is deposited on the CuMn alloy film and a heat treatment is thereafter performed, whereby the barrier film 136 made of MnSiO is formed.

However, the diffusion preventing film 129 formed on the lowermost layer of the second insulating layer 128 is made of SiCN or SiN, and no O is contained in the material therefor. Therefore, no barrier film of MnSiO is formed between the first wire 127 and each of the via 137 and the diffusion preventing film 129. Consequently, the barrier film 126 and the barrier film 136 are discontinuous. When external force is applied to the semiconductor device, therefore, stress may concentrate on the lower end portion (the portion surrounded by broken lines A) of the via 137 not covered with a barrier film, to cause the so-called stress migration.

Patent Document 1: Japanese Unexamined Patent Publication No. 8-274256
Patent Document 2: Japanese Unexamined Patent Publication No. 2005-277390

DISCLOSURE OF THE INVENTION

Problems to be Solved

An object of the present invention is to provide a semiconductor device and a method for manufacturing the same, capable of preventing Cu from diffusing into the periphery of an electrode or a wire without causing increase of a leakage current or occurrence of stress migration when a metallic material mainly composed of Cu is employed as the material for the electrode or the wire.

Solutions to the Problems

A semiconductor device according to an aspect of the present invention includes a first insulating layer made of a material containing Si and O, a groove shaped by digging down the first insulating layer, an embedded body, embedded in the first groove, made of a metallic material mainly composed of Cu, a second insulating layer, stacked on the first insulating layer and the embedded body, made of a material containing Si and O, and a barrier film, formed between the embedded body and each of the first insulating layer and the second insulating layer, made of MnSiO.

According to the structure, the groove is formed in the first insulating layer made of the material containing Si and O. The embedded body made of the metallic material mainly composed of Cu is embedded in the groove. The second insulating layer made of the material containing Si and O is stacked on the first insulating layer and the embedded body. The barrier film made of MnSiO is formed between the embedded body and each of the first insulating layer and the second insulating layer. The barrier film can prevent Cu contained in the embedded body from diffusing into the first insulating layer and the second insulating layer.

The embedded body may be an electrode, or may be a wire. When the semiconductor device includes an MIM capacitance element, for example, the embedded body may be a lower electrode constituting the MIM capacitance element. In other words, when the present invention is applied to a semiconductor device including an MIM capacitance element, the semiconductor device (hereinafter referred to as a "first semiconductor device" in this section) includes a first insulating layer made of a material containing Si and O, a lower groove shaped by digging down the first insulating layer, a lower electrode, embedded in the lower groove, made of a metallic material mainly composed of Cu, an insulating film, stacked on the lower electrode, in which at least a lowermost layer portion on the side of the lower electrode is made of $SiO_2$, an upper electrode, provided to be opposed to the lower electrode across the insulating film, made of a conductive material, and a first barrier film, formed between the lower electrode and each of the first insulating layer and the insulating film, made of MnSiO.

According to the structure, the lower electrode made of the metallic material mainly composed of Cu is embedded in the groove formed in the first insulating layer. The insulating film, in which at least the lowermost layer portion on the side of the lower electrode is made of $SiO_2$, is stacked on the lower electrode. The upper electrode made of the conductive material is formed on the insulating film. The upper electrode is opposed to the lower electrode across the insulating film. The first barrier film made of MnSiO is formed between the lower electrode and each of the first insulating layer and the insulating film.

The first barrier film can prevent Cu contained in the lower electrode from diffusing into the first insulating layer and the insulating film.

$SiO_2$ is employed as the material for at least the lowermost layer portion of the insulating film. Therefore, a leakage current can be reduced as compared with a case of preparing an insulating film of the same thickness from SiN or SiCN.

Further, the first barrier film functions as a capacitance film of the MIM capacitance element on the opposed portions of the lower electrode and the upper electrode, along with the insulating film. MnSiO serving as the material for the first barrier film is a high dielectric constant material (a High-k film material) whose dielectric constant is higher than that of $SiO_2$. Therefore, the first barrier film so functions as a part of the capacitance film that the capacitance value of the MIM capacitance element can be increased.

The first semiconductor device may include a W plug, provided to penetrate the insulating film and electrically connected to the lower electrode, made of W and a multilayer barrier film interposed between the W plug and the lower electrode and the insulating film. In this case, the multilayer barrier film preferably includes a Ta film in contact with the lower electrode and the insulating film and a TiN film in contact with the W plug.

The multilayer barrier film includes the TiN film, whereby, in a case where the W plug is formed by plasma CVD employing a $WF_6$ (tungsten hexafluoride) gas as a source gas (this method is hereinafter referred to as "W-CVD"), $WF_6$ can be prevented from diffusing into the insulating film and corroding the insulating film.

The W plug so comes into contact with the TiN film that excellent adhesiveness between the multilayer barrier film and the W plug can be exerted. On the other hand, the lower electrode so comes into contact with the Ta film that excellent adhesiveness between the multilayer barrier film and the lower electrode can be exerted. Thus, the multilayer barrier film can be prevented from exfoliation. Therefore, occurrence of stress migration can be prevented. Further, the TiN film and the lower electrode are not in contact with each other and Ta is poor in reaction with Cu, whereby the lower electrode made of the material mainly composed of Cu is not corroded. Therefore, occurrence of electromigration can be prevented.

The first semiconductor device may include a second insulating layer, stacked on the insulating film and the upper electrode, made of a material containing Si and O, an upper groove shaped by digging down the second insulating layer, a wire, embedded in the upper groove, made of a metallic material mainly composed of Cu, a via, provided to penetrate the insulating film and the second insulating layer on a portion where the lower electrode and the wire are opposed to each other, made of a metallic material mainly composed of Cu, and a second barrier film, formed between the wire and the second insulating layer and between the via and each of the insulating film and the second insulating layer continuously with the first barrier film, made of MnSiO.

The second barrier film can prevent Cu contained in the wire and the via from diffusing into the insulating film and the second insulating layer.

The first barrier film and the second barrier film are continuous with each other, whereby occurrence of stress migration around the connected portions of the via and the lower electrode can be prevented when external force is applied to the semiconductor device. Consequently, wiring reliability can be improved.

The first semiconductor device can be manufactured by a manufacturing method including steps (a) to (e), for example.

(a) forming, in a first insulating layer made of a material containing Si and O, a lower groove having a shape dug down from the surface thereof, (b) covering the inner surface of the lower groove with an alloy film made of an alloy material containing Cu and Mn, (c) forming a lower electrode embedded in the lower groove by depositing a metallic material mainly composed of Cu on the alloy film, (d) forming an insulating film made of $SiO_2$ on the lower electrode by CVD employing $SiH_4$ and $N_2O$, and (e) forming an upper electrode made of a conductive material on the insulating film and forming a diffusion preventing film between the lower electrode and the first insulating layer and between the lower electrode and the insulating film by a heat treatment.

In a technique of forming the insulating film made of $SiO_2$ by CVD employing a TEOS-$O_2$ gas, Cu contained in the lower electrode is oxidized, and a CuO (copper oxide) film is formed on the surface of the lower electrode. When the CuO film is formed on the surface of the lower electrode, contact resistance between the lower electrode and the W plug increases.

In the CVD employing $SiH_4$ and $N_2O$, on the other hand, the insulating film made of $SiO_2$ can be formed without forming a CuO film on the surface of the lower electrode.

When the semiconductor device has a multilayer interconnection structure, for example, the embedded body may be a wire included in the multilayer interconnection structure. In other words, when the present invention is applied to a semiconductor device having a multilayer interconnection structure, the semiconductor device (hereinafter referred to as a "second semiconductor device" in this section) includes a first insulating layer made of a material containing Si and O, a first groove shaped by digging down the first insulating layer, a first wire, embedded in the first groove, made of a metallic material mainly composed of Cu, a second insulating layer, stacked on the first insulating layer and the first wire, made of a material containing Si and O, a second groove shaped by digging down the second insulating layer, a second wire, embedded in the second groove, made of a metallic material mainly composed of Cu, a via, provided to penetrate the second insulating layer on a portion where the first wire and the second wire are opposed to each other, made of a metallic material mainly composed of Cu, and a barrier film, continuously formed between the first wire and each of the first insulating layer and the second insulating layer and between the second insulating layer and each of the second wire and the via, made of MnSiO.

According to the structure, the first wire made of the metallic material mainly composed of Cu is embedded in the first groove formed in the first insulating layer. The second insulating layer is stacked on the first insulating layer. The second wire mainly composed of Cu is embedded in the second groove formed in the second insulating layer. The first wire and the second wire are electrically connected with each other by the via penetrating the second insulating layer on the portion where the same are opposed to each other. The barrier film made of MnSiO is continuously formed between the first wire and each of the first insulating layer and the second insulating layer and between the second insulating layer and each of the second wire and the via.

The barrier film can prevent Cu contained in the first wire, the second wire and the via from diffusing into the first insulating layer and the second insulating layer. Therefore, occurrence of interwire leakage resulting from diffusion of Cu can be prevented.

The bottom portion (the lower end portion) of the via is covered with and protected by the barrier film, whereby occurrence of stress migration around the bottom portion of the via can be prevented when external force is applied to the semiconductor device. Consequently, wiring reliability can be improved.

$SiO_2$ abundantly contains O employed for formation of MnSiO, and hence the second insulating layer preferably has an interlayer film made of $SiO_2$ on the lowermost layer adjacent to the first insulating layer. Thus, the barrier film made of MnSiO film can be excellently formed between the bottom portion of the via and the second insulating layer and between the first wire and the second insulating layer.

The second semiconductor device can be manufactured by a manufacturing method including steps (f) to (m), for example.

(f) forming, in a first insulating layer made of a material containing Si and O, a first groove having a shape dug down from the surface thereof, (g) covering the inner surface of the first groove with a first alloy film made of an alloy material containing Cu and Mn, (h) forming a first wire embedded in the first groove by depositing a metallic material mainly composed of Cu on the first alloy film, (i) stacking a second insulating layer made of a material containing Si and O on the first insulating layer and the first wire, (j) forming, in the second insulating layer, a second groove having a shape dug down from the surface thereof and a via hole penetrating the space between the second groove and the first wire, (k) covering the inner surfaces of the second groove and the via hole with a second alloy film made of an alloy material containing Cu and Mn, (l) forming a second wire embedded in the second groove and a via embedded in the via hole by depositing a metallic material mainly composed of Cu on the second alloy film, and (m) forming a barrier film between the first wire and each of the first insulating layer and the second insulating layer and between the second insulating layer and each of the second wire and the via by a heat treatment.

The structure having the second insulating layer including the interlayer film can be obtained when the step of stacking the second insulating layer includes an interlayer film forming step of forming an interlayer film made of $SiO_2$ immediately on the first insulating layer by CVD not employing an $O_2$ gas.

In a technique of forming the interlayer film made of $SiO_2$ by CVD employing an $O_2$ gas, Cu contained in the first wire is oxidized, and a CuO film is formed on the surface of the first wire. When the CuO film is formed on the surface of the first wire, contact resistance between the first wire and the via increases.

In the CVD not employing an $O_2$ gas, more specifically in CVD employing $SiH_4$ (silane) and $N_2O$ (nitrous oxide) as source gases, on the other hand, the interlayer film made of $SiO_2$ can be formed without forming a CuO film on the surface of the first wire.

The foregoing and other objects, features and effects of the present invention will become more apparent from the following detailed description of the embodiments with reference to the attached drawings.

Figure 1:
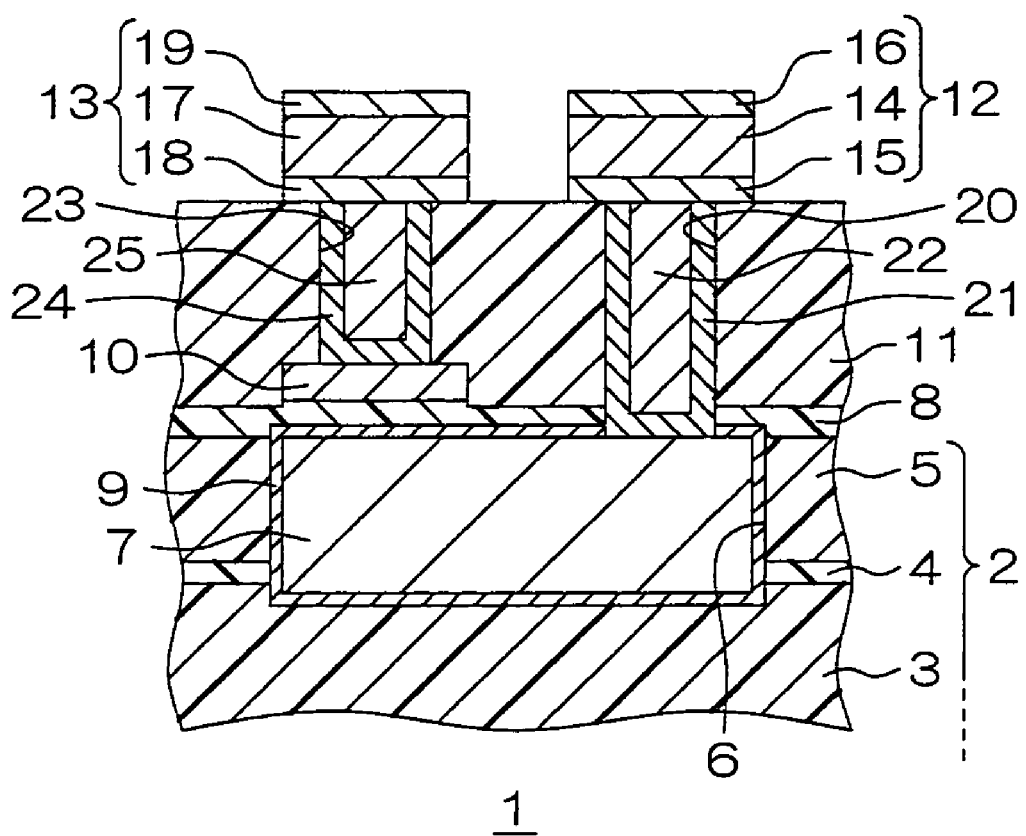
FIG. 1 is a schematic sectional view of a semiconductor device according to an embodiment of the present invention.

DESCRIPTION OF THE REFERENCE NUMERALS 1 semiconductor device
2 first insulating layer
6 lower groove
7 lower electrode
8 insulating film
9 first barrier film
10 upper electrode
11 second insulating layer
21 multilayer barrier film
22 W plug
24 multilayer barrier film
25 W plug
51 semiconductor device
52 wire
56 upper groove
57 contact hole (via hole)
58 contact (via)
59 second barrier film
61 semiconductor device
62 first insulating layer
66 first groove 67 first wire
68 second insulating layer
69 interlayer film
74 second groove
75 via hole
76 second wire
77 via
78 barrier film

BEST MODE FOR CARRYING OUT THE INVENTION

Embodiments of the present invention are now described in detail with reference to the attached drawings.

FIG. 1 is a schematic sectional view of a semiconductor device according to an embodiment of the present invention.

A semiconductor device 1 includes a semiconductor substrate (not shown). The semiconductor device consists of an Si substrate, for example. Functional elements such as a MOSFET (Metal Oxide Semiconductor Field-Effect Transistor) are provided in a surface layer portion of the semiconductor device.

A first insulating layer 2 is stacked on the semiconductor substrate. The first insulating layer 2 is formed by stacking an interlayer dielectric film 3 of $SiO_2$, an etching stopper film 4 of SiC and an interlayer dielectric film 5 of $SiO_2$ in this order from the side of the semiconductor substrate.

A lower groove 6 is formed in a surface layer portion of the first insulating layer 2. A lower electrode 7 made of Cu is embedded in the lower groove 6.

An insulating film 8 of $SiO_2$ is stacked on the first insulating layer 2 and the lower electrode 7.

A first barrier film 9 for preventing Cu from diffusing into the first insulating layer 2 and the insulating film 8 is formed between the lower electrode 7 and each of the first insulating layer 2 and the insulating film 8. The first barrier film 9 is made of MnSiO.

An upper electrode 10 of TiN is formed on the insulating film 8. The upper electrode 10 is opposed to the lower electrode 7 across the insulating film 8, and has a smaller outer shape than the lower electrode 7 in plan view. Thus, the semiconductor device 1 includes a capacitance element of an MIM structure having the first barrier film 9 and the insulating film 8 as capacitance films, which are held between the lower electrode 7 and the upper electrode 10.

A second insulating layer 11 made of $SiO_2$ is stacked on the insulating film 8 and the upper electrode 10.

Wires 12 and 13 are formed on the second insulating layer 11.

The wire 12 includes a wire body 14 of an Al—Cu alloy, a lower barrier film 15, provided on the lower surface side of the wire body 14, having a multilayer structure of a TiN layer and a Ti layer, and an upper barrier film 16 of TiN, provided on the upper surface side of the wire body 14. A single-layer TiN barrier film of TiN may be provided in place of the lower barrier film 15.

The wire 13 includes a wire body 17 of an Al—Cu alloy, a lower barrier film 18, provided on the lower surface side of the wire body 17, having a multilayer structure of a TiN layer and a Ti layer, and an upper barrier film 19 of TiN, provided on the upper surface side of the wire body 17. A single-layer TiN barrier film of TiN may be provided in place of the lower barrier film 18.

In the second insulating layer 11 and the insulating film 8, a contact hole 20 penetrating the films in the thickness direction is formed on a portion where the lower electrode 7 and the wire 12 are opposed to each other. The side surface of the contact hole 20 and a portion of the lower electrode 7 facing the contact hole 20 are covered with a multilayer barrier film 21.

The multilayer barrier film 21 has a multilayer structure of a Ta barrier layer, a TaN barrier layer, a Ti barrier layer and a TiN barrier layer. The outermost Ta barrier layer is in contact with the side surface of the contact hole 20 and the lower electrode 7.

A W plug 22 of W (tungsten) is formed in the contact hole 20 covered with the multilayer barrier film 21. The upper end of the W plug 22 is connected to the wire 12, while the lower end thereof is connected to the lower electrode 7. Thus, the wire 12 and the lower electrode 7 are electrically connected with each other through the W plug 22.

In the second insulating layer 11, a contact hole 23 penetrating the second insulating layer 11 in the thickness direction is formed on a portion where the upper electrode 10 and the wire 13 are opposed to each other. The side surface of the contact hole 23 and a portion of the upper electrode 10 facing the contact hole 23 are covered with a multilayer barrier film 24. The multilayer barrier film 24 has a multilayer structure of a Ta barrier layer, a TaN barrier layer, a Ti barrier layer and a TiN barrier layer, similarly to the multilayer barrier film 21.

A W plug 25 of W is formed in the contact hole 23 covered with the multilayer barrier film 24. The upper end of the W plug 25 is connected to the wire 13, while the lower end thereof is connected to the upper electrode 10. Thus, the wire 13 and the upper electrode 10 are electrically connected with each other through the W plug 25.

FIGS. 2A to 2M are schematic sectional views successively showing steps of manufacturing the semiconductor device.

Figure 2A:
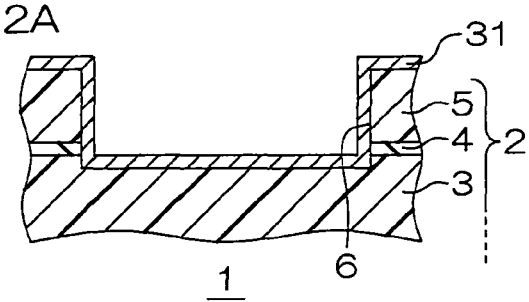
FIG. 2A is a schematic sectional view for illustrating a method for manufacturing the semiconductor device shown in FIG. 1.

First, the semiconductor substrate having the first insulating layer 2 on the outermost surface is prepared. Then, the lower groove 6 is formed in the surface layer portion of the first insulating layer 2 through a photolithography step and an etching step. Then, the overall region of the surface of the first insulating layer 2 including the inner surface of the lower groove 6 is covered with an alloy film 31 of an alloy of Cu and Mn by sputtering, as shown in FIG. 2A.

Figure 2B:
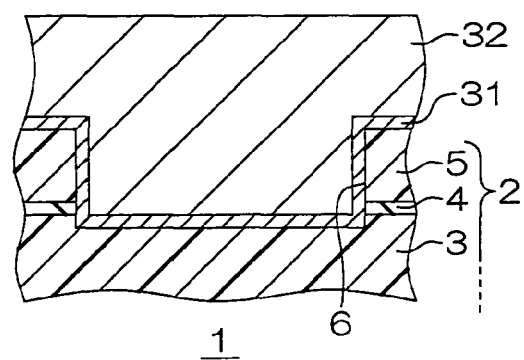
FIG. 2B is a schematic sectional view showing a step subsequent to FIG. 2A.

Then, a metallic material layer 32 mainly composed of Cu is formed on the alloy film 31 by plating, as shown in FIG. 2B. The metallic material layer 32 is formed with a thickness for filling up the lower groove 6.

Figure 2C:
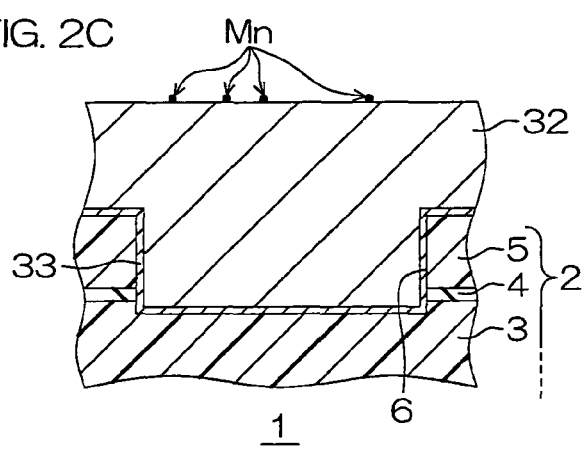
FIG. 2C is a schematic sectional view showing a step subsequent to FIG. 2B.

Thereafter a heat treatment is so performed that Mn (manganese) in the alloy film 31 combines with Si and O (oxygen) contained in the first insulating layer 2 and an MnSiO film 33 is formed, as shown in FIG. 2C. At this time, part of Mn in the alloy film 31 moves in the metallic material layer 32, and is deposited on the surface of the metallic material layer 32. Following the formation of the MnSiO film 33, the alloy film 31 is generally integrated with the metallic material layer 32.

Figure 2D:
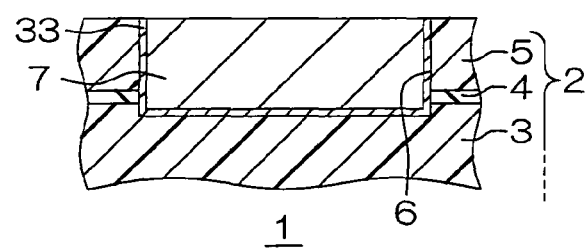
FIG. 2D is a schematic sectional view showing a step subsequent to FIG. 2C.

Then, the metallic material layer 32 and the MnSiO film 33 are polished by CMP. The polishing is continued until unnecessary portions of the metallic material layer 32 and the MnSiO film 33 formed outside the lower groove 6 are entirely removed, the surface of the first insulating layer 2 located outside the lower groove 6 is exposed, and the surface of the first insulating layer 2 and the surface of the metallic material layer 32 in the lower groove 6 are flush with each other, as shown in FIG. 2D. Thus, the lower electrode 7 embedded in the lower groove 6 is obtained.

Figure 2E:
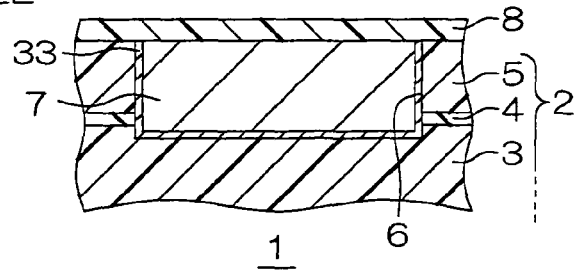
FIG. 2E is a schematic sectional view showing a step subsequent to FIG. 2D.

Then, the insulating film 8 is stacked on the first insulating layer 2 and the lower electrode 7 by CVD employing $SiH_4$ and $N_2O$ as source gases, as shown in FIG. 2E.

Figure 2F:
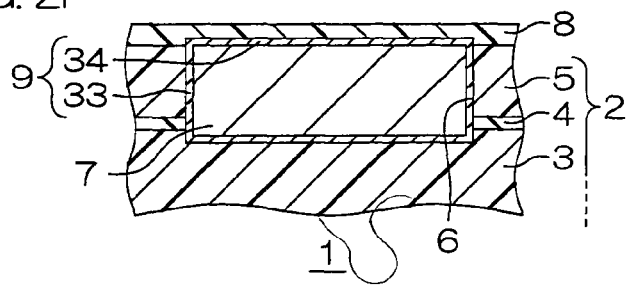
FIG. 2F is a schematic sectional view showing a step subsequent to FIG. 2E.

After the stacking of the insulating layer 8, a heat treatment is performed again. Mn having remained in the lower electrode 7 combines with Si and O contained in the insulating film 8 due to the heat treatment, and an MnSiO film 32 is formed between the insulating film 8 and the lower electrode 7, as shown in FIG. 2F. Consequently, the first barrier film 9 consisting of the MnSiO films 33 and 34 is formed between the first insulating layer 2 and the lower electrode 7 and between the insulating film 8 and the lower electrode 7.

Figure 2G:
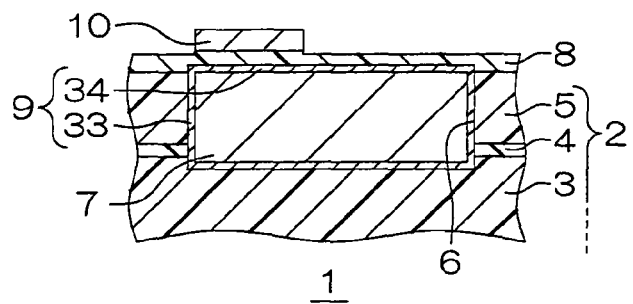
FIG. 2G is a schematic sectional view showing a step subsequent to FIG. 2F.

Then, a metallic material film (not shown) is formed on the overall surface of the insulating film 8 by sputtering. Thereafter the metallic material film is removed through a photolithography step and an etching step, except for a part opposed to the lower electrode 7 across the insulating film 8. Thus, the upper electrode 10 is formed, as shown in FIG. 2G.

Figure 2H:
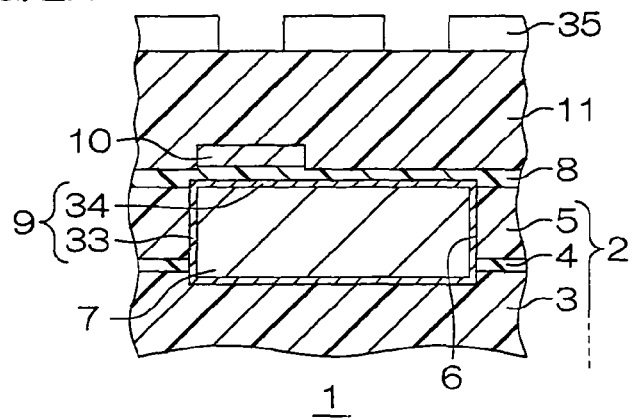
FIG. 2H is a schematic sectional view showing a step subsequent to FIG. 2G.
Figure 2:
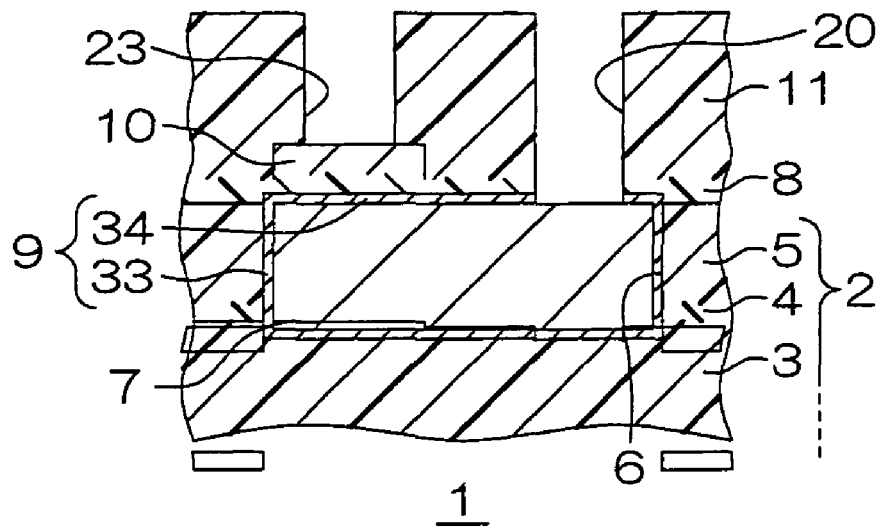
FIG. 2I is a schematic sectional view showing a step subsequent to FIG. 2H.
FIG. 2J is a schematic sectional view showing a step subsequent to FIG. 2I.
FIG. 2K is a schematic sectional view showing a step subsequent to FIG. 2J.
FIG. 2L is a schematic sectional view showing a step subsequent to FIG. 2K.
FIG. 2M is a schematic sectional view showing a step subsequent to FIG. 2L.

Thereafter the second insulating layer 11 is stacked on the insulating film 8 and the upper electrode 10 by CVD, as shown in FIG. 2H. Then, a resist pattern 35 having openings exposing only portions for forming the contact holes 20 and 23 is formed on the second insulating layer 11.

The second insulating layer 11 is etched through the resist pattern 35 serving as a mask, until the lower electrode 7 and the upper electrode 10 are exposed respectively. Thus, the contact hole 20 partially exposing the lower electrode 7 and the contact hole 23 partially exposing the upper electrode 10 are formed, as shown in FIG. 2I. After the formation of the contact holes 20 and 23, the resist pattern 35 is removed.

Figure 2J:
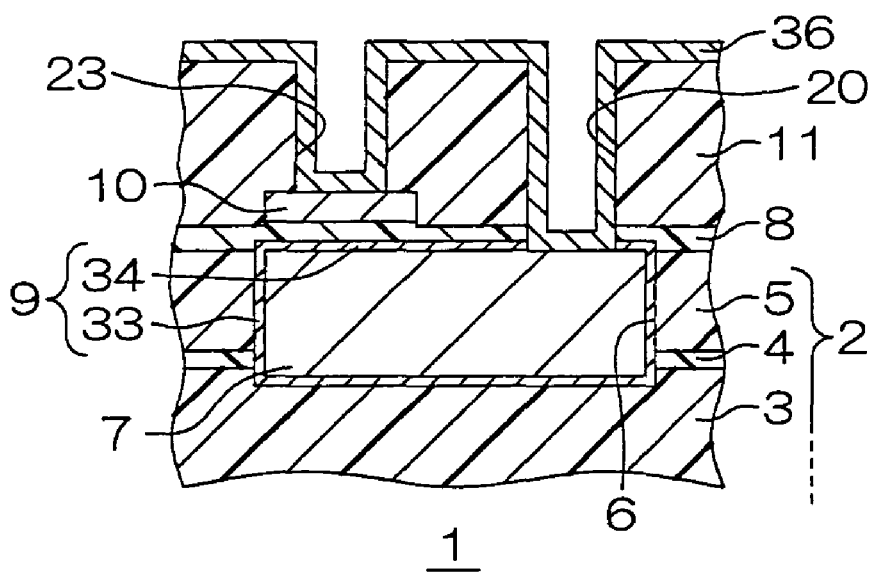

Then, a multilayer barrier film 36 is formed by successively stacking a Ta barrier layer, a TaN barrier layer, a Ti barrier layer and a TiN barrier layer on the overall regions of the exposed surfaces (including the side surfaces of the contact holes 20 and 23) of the second insulating layer 11, the upper electrode 10 and the lower electrode 7 by CVD, as shown in FIG. 2J.

Figure 2K:
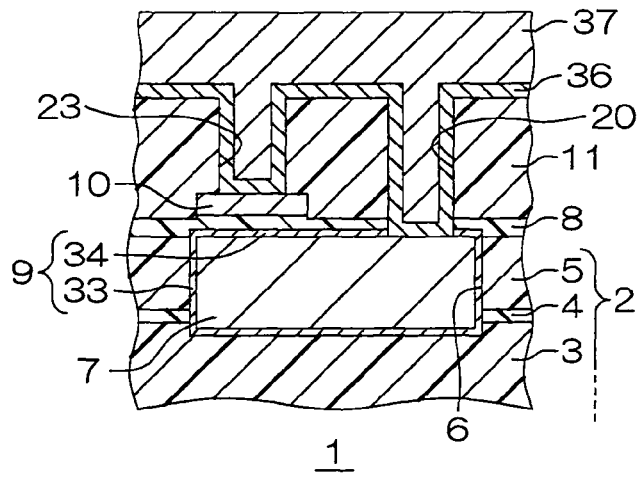

Thereafter a W layer 37 of W is formed on the multilayer barrier film 36 by W-CVD, as shown in FIG. 2K. The W layer 37 is formed with a thickness for filling up the contact holes 20 and 23.

Figure 2L:
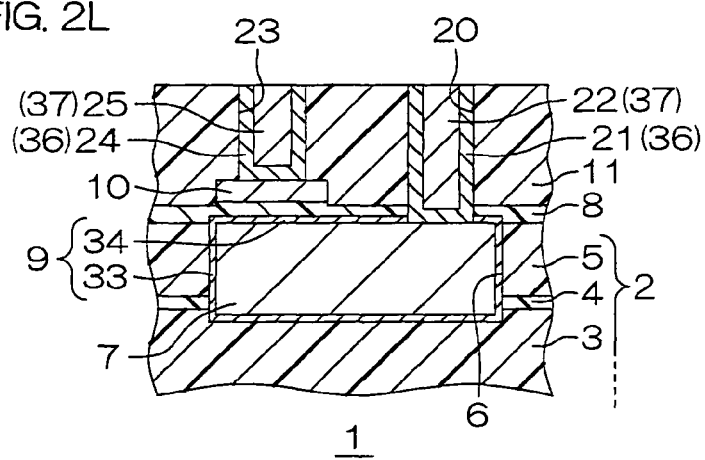

After the formation of the W layer 37, the W layer 37 and the multilayer barrier film 36 are polished by CMP. The polishing is continued until unnecessary portions of the W layer 37 and the multilayer barrier film 36 formed outside the contact holes 20 and 23 are entirely removed, the surface of the second insulating layer 11 located outside the contact holes 20 and 23 is exposed, and the surface of the second insulating layer 11 and the surfaces of the W layer 37 and the multilayer barrier film 36 in the contact holes 20 and 23 are flush with each other, as shown in FIG. 2L. Thus, a portion of the multilayer barrier film 36 covering the side surface of the contact hole 20 and the upper surface of the lower electrode 7 forms the multilayer barrier film 21, while a portion thereof covering the side surface of the contact hole 23 and the upper surface of the upper electrode 10 forms the multilayer barrier film 24. Further, a portion of the W layer 37 remaining in the contact hole 20 forms the W plug 22, while a portion thereof remaining in the contact hole 23 forms the W plug 25.

Figure 2M:
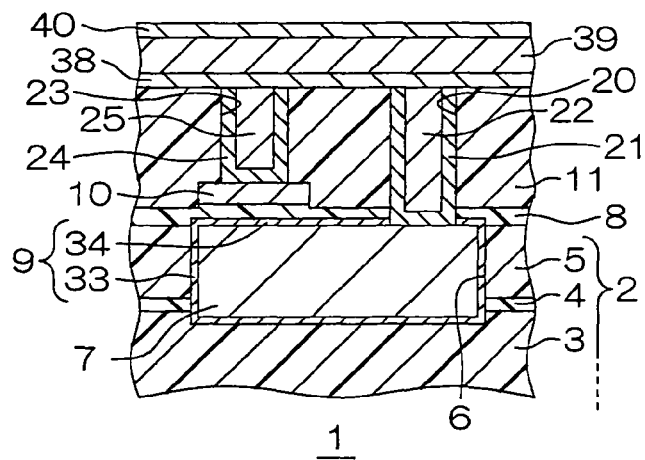

Then, a TiN/Ti layer 38, an Al—Cu alloy layer 39 and a TiN layer 40 are stacked on the second insulating layer 11 and the W plugs 22 and 25 in this order by sputtering, as shown in FIG. 2M.

Thereafter the TiN/Ti layer 38, the Al—Cu alloy layer 39 and the TiN layer 40 are selectively removed through a photolithography step and an etching step, whereby the wires 12 and 13 are formed, as shown in FIG. 1. Thus, the semiconductor device 1 shown in FIG. 1 is obtained.

In the semiconductor device 1, as hereinabove described, the lower groove 6 is formed in the first insulating layer 2 made of the material containing Si and O, and the lower electrode 7 made of the metallic material mainly composed of Cu is embedded in the lower groove 6. The insulating film 8 in which at least the lowermost layer portion on the side of the lower electrode 7 is made of $SiO_2$ is stacked on the lower electrode 7. The upper electrode 10 made of the conductive material is formed on the insulating film 8. The upper electrode 10 is opposed to the lower electrode 7 through the insulating film 8. The first barrier film 9 of MnSiO is formed between the lower electrode 7 and each of the first insulating layer 2 and the insulating film 8.

The first barrier film 9 can prevent Cu contained in the lower electrode 7 from diffusing into the first insulating layer 2 and the insulating film 8.

$SiO_2$ is employed as the material for the insulating film 8. In an MIM capacitance element having the insulating film 8 of $SiO_2$, a leakage current can be reduced as compared with an MIM capacitance element having a capacitance film of SiN or SiCN having the same thickness as the insulating film 8.

Further, the first barrier film 9 functions as a capacitance film of the MIM capacitance element on a portion where the lower electrode 7 and the upper electrode 10 are opposed to each other, along with the insulating film 8. MnSiO serving as the material for the first barrier film 9 is a high dielectric constant material (a High-k film material) whose dielectric constant is higher than that of $SiO_2$. Therefore, the first barrier film 9 so functions as a part of the capacitance film that the capacitance value of the MIM capacitance element can be increased.

The W plug 22 penetrates the insulating film 8 and is electrically connected with the lower electrode 7. The multilayer barrier film 21 is interposed between the insulating film 8 and the W plug 22 and between the lower electrode 7 and the W plug 22.

A portion of the multilayer barrier film 21 in contact with the W plug 22 is formed by the TiN barrier layer. When a $WF_6$ gas is supplied onto the multilayer barrier film 21 (in the step shown in FIG. 2K), therefore, the $WF_6$ gas can be prevented from diffusing into the second insulating layer 11 and the insulating film 8 and corroding the second insulating layer 11 and the insulating film 8.

The W plug 22 so comes into contact with the TiN barrier layer of the multilayer barrier film 21 that excellent adhesiveness between the multilayer barrier film 21 and the W plug 22 can be exerted. On the other hand, the lower electrode 7 so comes into contact with the Ta barrier layer of the multilayer barrier film 21 that excellent adhesiveness between the multilayer barrier film 21 and the lower electrode 7 can be exerted. Thus, the multilayer barrier film 21 can be prevented from exfoliation. Therefore, occurrence of stress migration can be prevented. Further, the TiN barrier layer and the lower electrode 7 are not in contact with each other and Ta is poor in reaction with Cu, whereby the lower electrode 7 made of Cu is not corroded. Therefore, occurrence of electromigration can be prevented.

Consequently, connection reliability between the lower electrode 7 and the wire 12 can be improved.

In the multilayer barrier film 21, the TaN barrier layer is interposed between the Ta barrier layer and the TiN barrier layer. TaN is superior in ability (Cu diffusion preventability) of preventing Cu from diffusing into an insulating material such as $SiO_2$, for example, as compared with Ta. Therefore, Cu in the lower electrode 7 can be prevented from diffusing into the second insulating layer 11.

In the multilayer barrier film 21, further, the Ti barrier layer is interposed between the TaN barrier layer and the TiN barrier layer. Ti has excellent adhesiveness with respect to TaN and TiN. Therefore, adhesiveness between the TaN barrier layer and the TiN barrier layer can be improved. Consequently, the multilayer barrier film 21 can be further prevented from exfoliation.

When the insulating film 8 is stacked on the first insulating layer 2 and the lower electrode 7, the CVD employing $SiH_4$ and $N_2O$ as the source gases is employed. Thus, the insulating film 8 made of $SiO_2$ can be formed without forming a CuO film on the surface of the lower electrode 7.

The insulating film 8 may simply have an $SiO_2$ layer at least on the lowermost layer on the side of the lower electrode 7, and a layer made of another insulating material such as SiN, SiC or SiCN may be stacked on the $SiO_2$ layer. When the insulating film 8 has the $SiO_2$ layer on the lowermost layer, the first barrier film 9 (the MnSiO film 34) made of MnSiO can be formed between the insulating film 8 and the lower electrode 7.

According to the manufacturing method shown in FIGS. 2A to 2M, the heat treatment for forming the MnSiO film 33 between the first insulating layer 2 and the lower electrode 7 and the heat treatment for forming the MnSiO film 34 between the insulating film 8 and the lower electrode 7 are dividedly performed in two steps. However, the MnSiO films 33 and 34 may be formed through a single heat treatment step. In other words, the step is carried out without performing the heat treatment after the metallic material layer 32 is deposited. The first barrier film 9 (the MnSiO films 33 and 34) of MnSiO may be formed between the lower electrode 7 and each of the first insulating layer 2 and the insulating film 8 through the same step by performing the heat treatment after stacking the insulating film 8.

Figure 3:
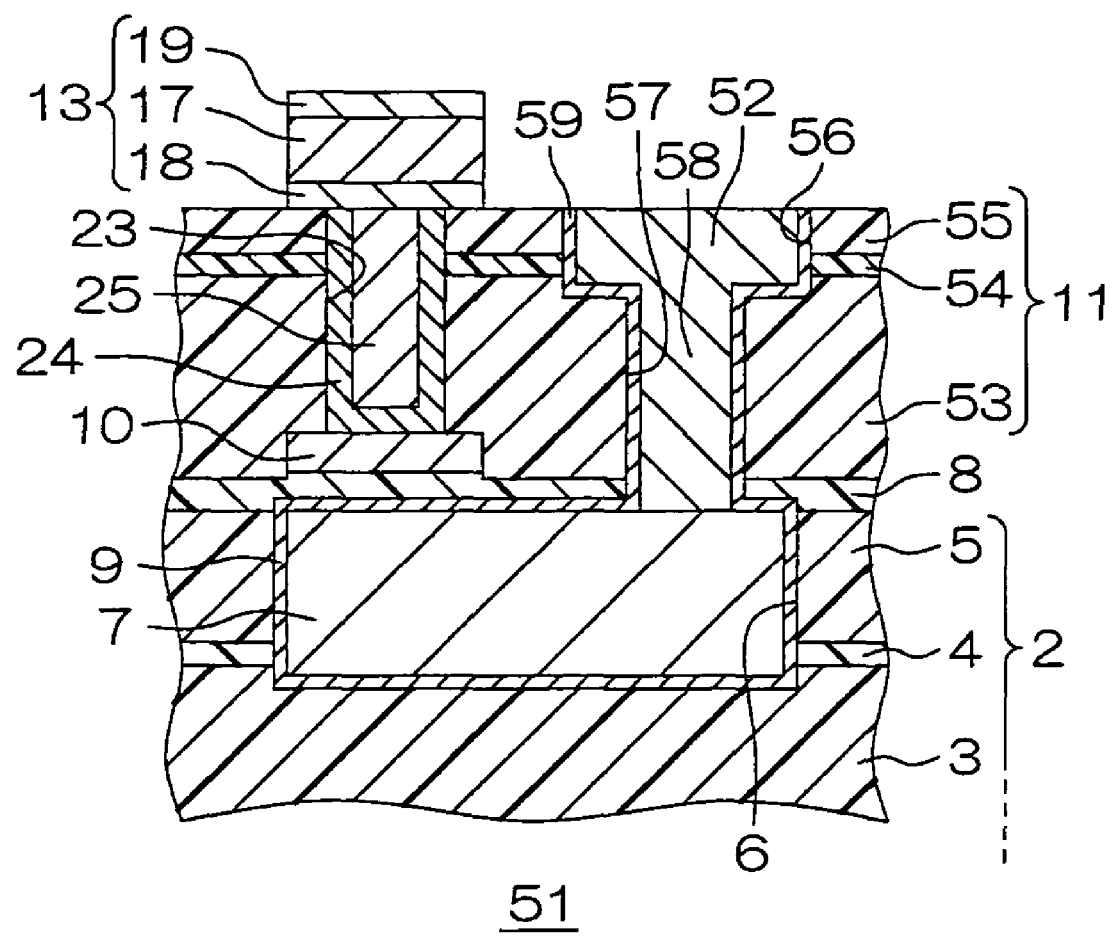
FIG. 3 is a schematic sectional view of a semiconductor device according to another embodiment of the present invention.

FIG. 3 is a schematic sectional view of a semiconductor device according to another embodiment of the present invention. Referring to FIG. 3, portions corresponding to the respective portions shown in FIG. 1 are denoted by reference numerals identical to those in the case of FIG. 1. In the following, only points different from those of the structure shown in FIG. 1 are described, while description as to the respective portions denoted by the same reference numerals is omitted.

In the semiconductor device 1 shown in FIG. 1, both of the wires 12 and 13 are formed on the second insulating layer 11. In a semiconductor device 51 shown in FIG. 3, on the other hand, a wire 52 electrically connected with a lower electrode 7 is embedded in a second insulating layer 11.

In the semiconductor device 51, the second insulating layer 11 is formed by stacking an interlayer dielectric film 53 of $SiO_2$, an etching stopper film 54 of SiC and an interlayer dielectric film 55 of $SiO_2$ in this order from the side of the lower electrode 7.

An upper groove 56 is formed in a surface layer portion of the second insulating layer 11. The wire 52 made of Cu is embedded in the upper groove 56. In the second insulating layer 11, a contact hole 57 is formed to penetrate the second insulating layer 11, an insulating film 8 and a first barrier film 9 on a portion where the upper groove 56 and the lower electrode 7 are opposed to each other. A contact 58 of Cu is embedded in the contact hole 57. The contact 58 is integrally connected to the wire 52, and connected to the lower electrode 7. A second barrier film 59 of MnSiO is formed between the wire 52 and the second insulating layer 11 and between the contact 58 and each of the insulating film 8 and the second insulating layer 11 continuously with the first barrier film 9.

Effects similar to those of the structure shown in FIG. 1 can be attained also according to this structure. In addition, the wire 52 is made of Cu, whereby wiring resistance can be reduced as compared with the structure shown in FIG. 1.

Further, the second barrier film 59 can prevent Cu contained in the wire 52 and the contact 58 from diffusing into the insulating film 8 and the second insulating layer 11.

In addition, the first barrier film 9 and the second barrier film 59 are continuous to each other, whereby occurrence of stress migration around connected portions of the contact 58 and the lower electrode 7 can be prevented when external force is applied to the semiconductor device 51. Consequently, wiring reliability can be improved.

Figure 4:
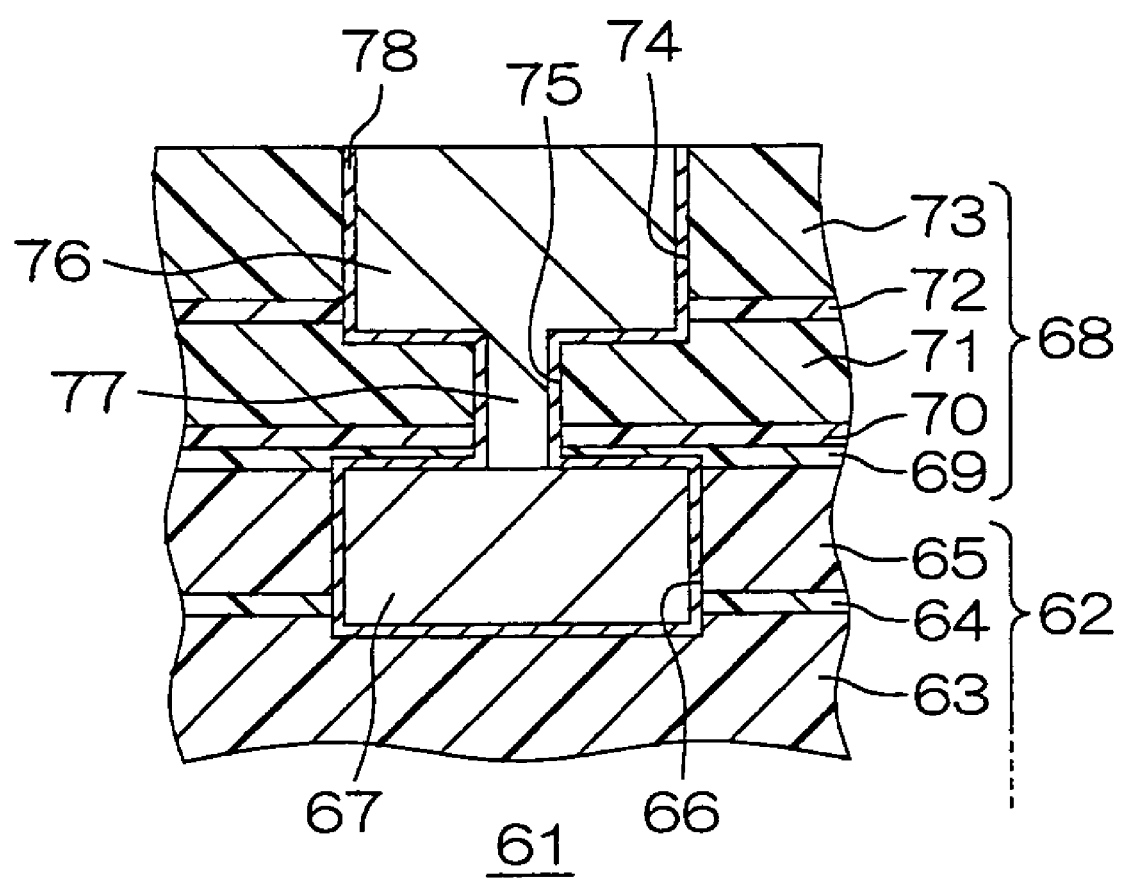
FIG. 4 is a schematic sectional view of a semiconductor device according to still another embodiment of the present invention.

FIG. 4 is a schematic sectional view of a semiconductor device according to still another embodiment of the present invention.

A semiconductor device 61 has a multilayer interconnection structure employing a Cu wiring material on a semiconductor substrate (not shown).

The semiconductor substrate consists of an Si substrate, for example. Functional elements such as a MOSFET (Metal Oxide Semiconductor Field-Effect Transistor) are provided in a surface layer portion of the semiconductor substrate.

A first insulating layer 62 is stacked on the semiconductor substrate. The first insulating layer 62 is formed by stacking an interlayer dielectric film 63, an etching stopper film 64 and an interlayer dielectric film 65 in this order from the side of the semiconductor substrate. The interlayer dielectric films 63 and 65 are made of $SiO_2$, for example. The etching stopper film 64 is made of SiC, for example.

A first groove 66 corresponding to a prescribed wiring pattern is formed in a surface layer portion of the first insulating layer 62. A first wire 67 of Cu is embedded in the first groove 66.

A second insulating layer 68 is stacked on the first insulating layer 62 and the first wire 67. The second insulating layer 68 is formed by stacking an interlayer film 69, an etching stopper film 70, an interlayer dielectric film 71, an etching stopper film 72 and an interlayer dielectric film 73 in this order from the side of the first insulating layer 62. The interlayer film 69 is made of $SiO_2$, for example. The same material as the etching stopper film 64 can be employed as the material for the etching stopper films 70 and 72. Further, the same material as the interlayer dielectric films 63 and 65 can be employed as the material for the interlayer dielectric films 71 and 73.

A second groove 74 corresponding to a prescribed wiring pattern is formed in a surface layer portion of the second insulating layer 68. In the second insulating layer 68, a via hole 75 is penetratingly formed on a portion where the second groove 74 and the first wire 67 are opposed to each other.

A second wire 76 of Cu and a via 77 of Cu are embedded in the second groove 74 and the via hole 75 respectively. The second wire 76 and the via 77 are integrated with each other.

A barrier film 78 made of MnSiO is formed between the first wire 67 and each of the first insulating layer 62 and the second insulating layer 68 (the interlayer film 69) and between the second insulating film 68 and each of the second wire 76 and the via 77.

FIGS. 5A to 5L are schematic sectional views successively showing steps of manufacturing the semiconductor device.

Figure 5A:
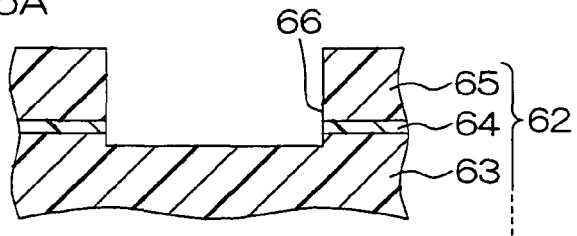
FIG. 5A is a schematic sectional view for illustrating a method for manufacturing the semiconductor device shown in FIG. 4.

First, the semiconductor substrate having the first insulating layer 62 on the outermost surface is prepared. Then, the first groove 66 is formed in the surface layer portion of the first insulating layer 62 through a photolithography step and an etching step, as shown in FIG. 5A.

Figure 5B:
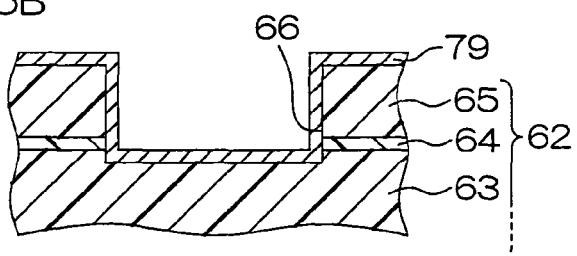
FIG. 5B is a schematic sectional view showing a step subsequent to FIG. 5A.

Then, the overall region of the surface of the first insulating layer 62 including the inner surface of the first groove 66 is covered with an alloy film 79 of an alloy of Cu and Mn by sputtering, as shown in FIG. 5B.

Figure 5C:
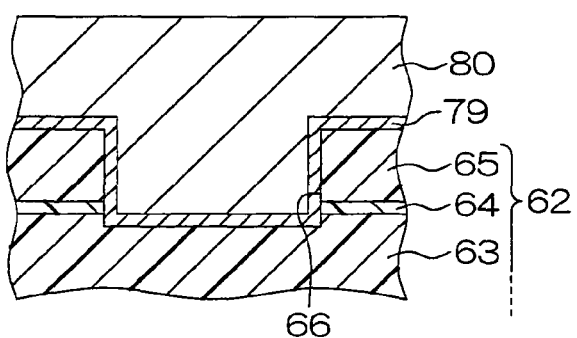
FIG. 5C is a schematic sectional view showing a step subsequent to FIG. 5B.

Then, a metallic material layer 80 mainly composed of Cu is formed on the alloy film 79 by plating, as shown in FIG. 5C. The metallic material layer 80 is formed with a thickness for filling up the first groove 66.

Figure 5D:
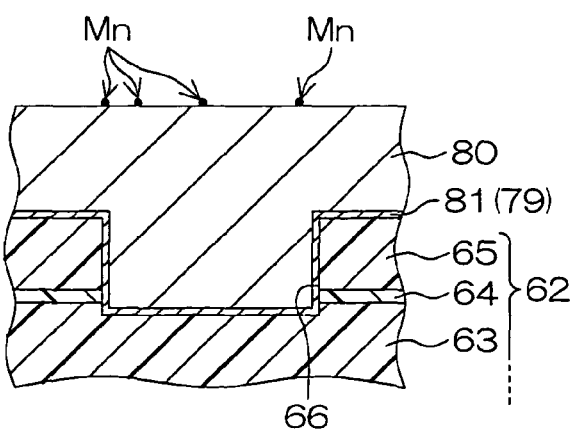
FIG. 5D is a schematic sectional view showing a step subsequent to FIG. 5C.

Thereafter a heat treatment is so performed that Mn in the alloy film 79 combines with Si and O contained in the first insulating layer 62 and an MnSiO film 81 is formed, as shown in FIG. 5D. At this time, part of Mn in the alloy film 79 moves in the metallic material layer 80, and is deposited on the surface of the metallic material layer 80. Following the formation of the MnSiO film 81, the alloy film 79 is generally integrated with the metallic material layer 80.

Figure 5E:
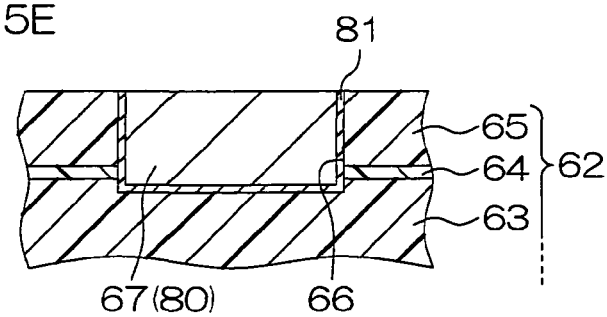
FIG. 5E is a schematic sectional view showing a step subsequent to FIG. 5D.

Then, the metallic material layer 80 and the MnSiO film 81 are polished by CMP. The polishing is continued until unnecessary portions of the metallic material layer 80 and the MnSiO film 81 formed outside the first groove 66 are entirely removed, the surface of the first insulating layer 62 located outside the first groove 66 is exposed and the surface of the first insulating layer 62 and the surface of the metallic material layer 80 in the first groove 66 are flush with each other, as shown in FIG. 5E. Thus, the first wire 67 embedded in the first groove 66 is obtained.

Figure 5F:
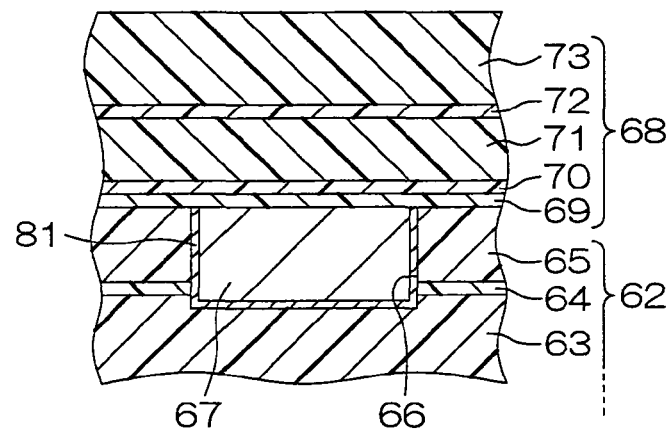
FIG. 5F is a schematic sectional view showing a step subsequent to FIG. 5E.

Then, the interlayer film 69, the etching stopper film 70, the interlayer dielectric film 71, the etching stopper film 72 and the interlayer dielectric film 73 are stacked on the first insulating layer 62 and the first wire 67 in this order by CVD, as shown in FIG. 5F. Thus, the second insulating layer 68 is formed on the first insulating layer 62 and the first wire 67.

While a TEOS-$O_2$ gas is generally employed as a source material for forming an $SiO_2$ film by CVD, a CuO film is formed on the surface of the first wire 67 in CVD employing a TEOS-$O_2$ gas. When a CuO film is formed on the surface of the first wire 67, contact resistance between the first wire 67 and the via 77 increases. Therefore, the interlayer film 69 is formed by CVD employing $SiH_4$ and $N_2O$ as source gases. Thus, the interlayer film 69 made of $SiO_2$ is formed on the first insulating layer 62 and the first wire 67 without oxidizing the surface of the first wire 67.

Figure 5G:
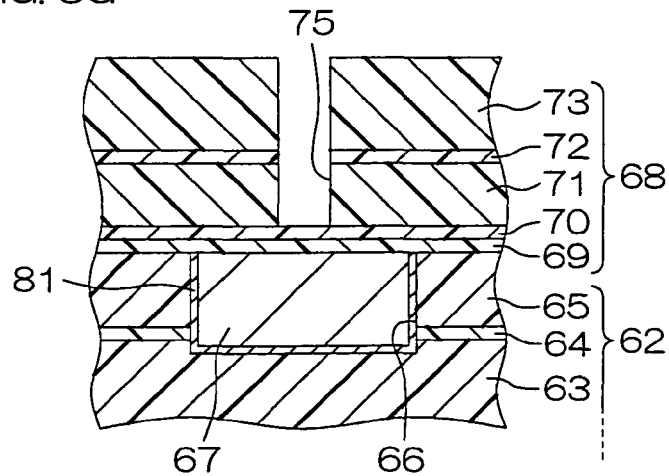
FIG. 5G is a schematic sectional view showing a step subsequent to FIG. 5F.

Thereafter a resist pattern (not shown) having an opening exposing only a portion for forming the via hole 75 is formed on the second insulating layer 68. The interlayer dielectric film 73, the etching stopper film 72 and the interlayer dielectric film 71 are dry-etched through the resist pattern serving as a mask, whereby the via hole 75 is formed, as shown in FIG. 5G. At this time, the interlayer dielectric film 73, the etching stopper film 72 and the interlayer dielectric film are continuously etched by switching reaction gases (etchants) at proper timing. The etching of the interlayer dielectric film 71 is stopped when the etching stopper film 70 is exposed.

Figure 5H:
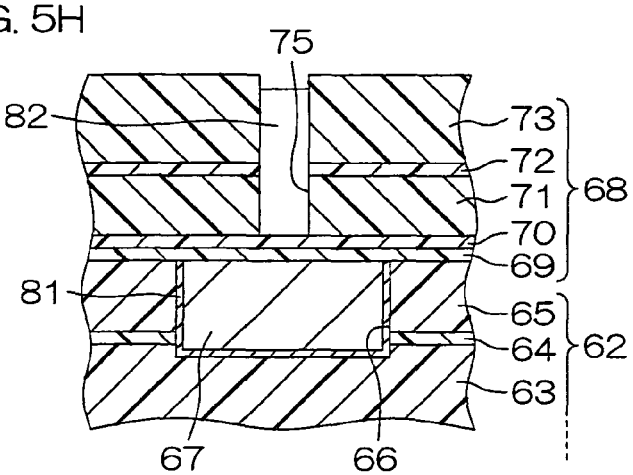
FIG. 5H is a schematic sectional view showing a step subsequent to FIG. 5G.

As shown in FIG. 5H, the via hole 75 is filled up with an embedded material 82, in order to reduce the irregularities on the surface of the semiconductor device 1. This is because the focal depth in a photolithography step for forming a resist pattern 83 described below is not excellently settled and exposure of high resolution cannot be performed if the irregularities on the surface of the semiconductor device 1 are large.

Figure 5I:
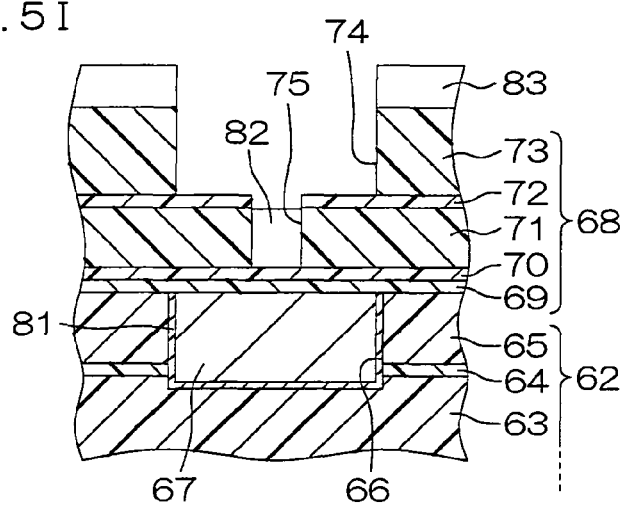
FIG. 5I is a schematic sectional view showing a step subsequent to FIG. 5H.

As shown in FIG. 5I, the resist pattern 83 having an opening exposing only a portion for forming the second groove is formed and the second insulating layer 68 is etched through the resist pattern 83 serving as a mask until the etching stopper film 72 is exposed, whereby the second groove 74 is formed. After the formation of the second groove 74, the embedded material 82 and the resist pattern 83 are removed.

Figure 5J:
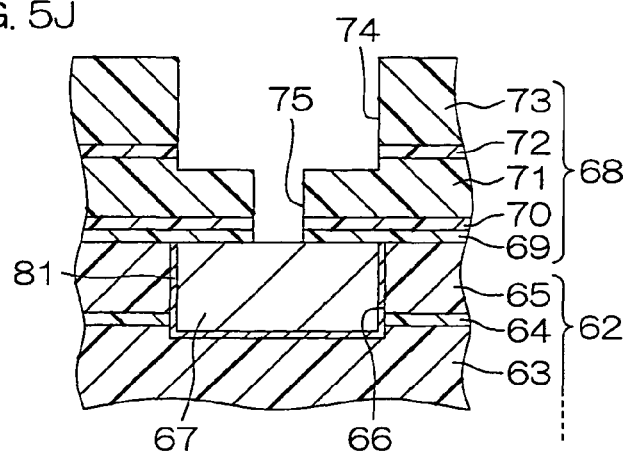
FIG. 5J is a schematic sectional view showing a step subsequent to FIG. 5I.

Then, portions of the interlayer film 69 and the etching stopper film 70 corresponding to the via hole 75 are etched, whereby the first wire 67 is partially exposed through the via hole 75, as shown in FIG. 5J.

Figure 5K:
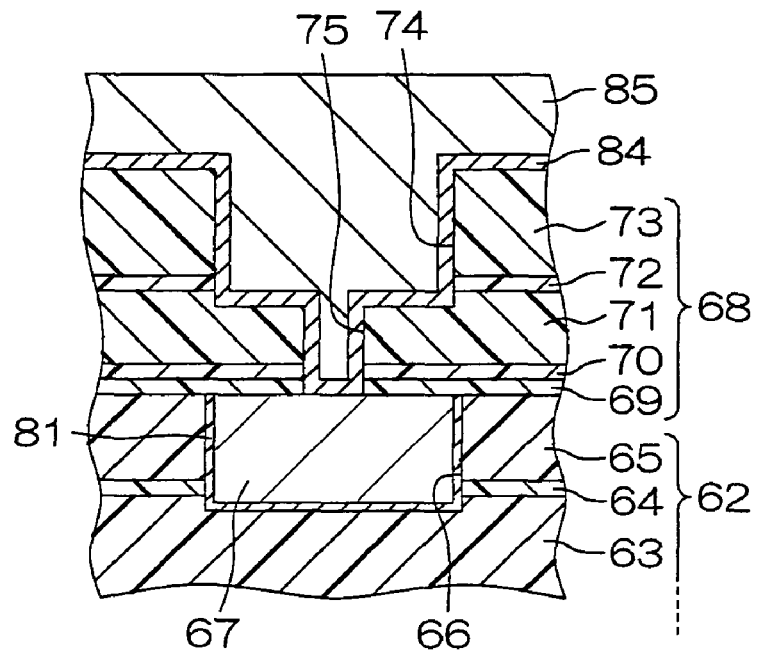
FIG. 5K is a schematic sectional view showing a step subsequent to FIG. 5J.

Then, the overall region of the surface of the second insulating layer 68 including the inner surface of the second groove 74 and the inner surface of the via hole 75 and a portion of the first wire 67 facing the via hole 75 are covered with an alloy film 84 of an alloy of Cu and Mn, as shown in FIG. 5K. Then, a metallic material layer 85 mainly composed of Cu is formed on the alloy film 84 by plating. The metallic material layer 85 is formed with a thickness for filling up the second groove 74.

Figure 5L:
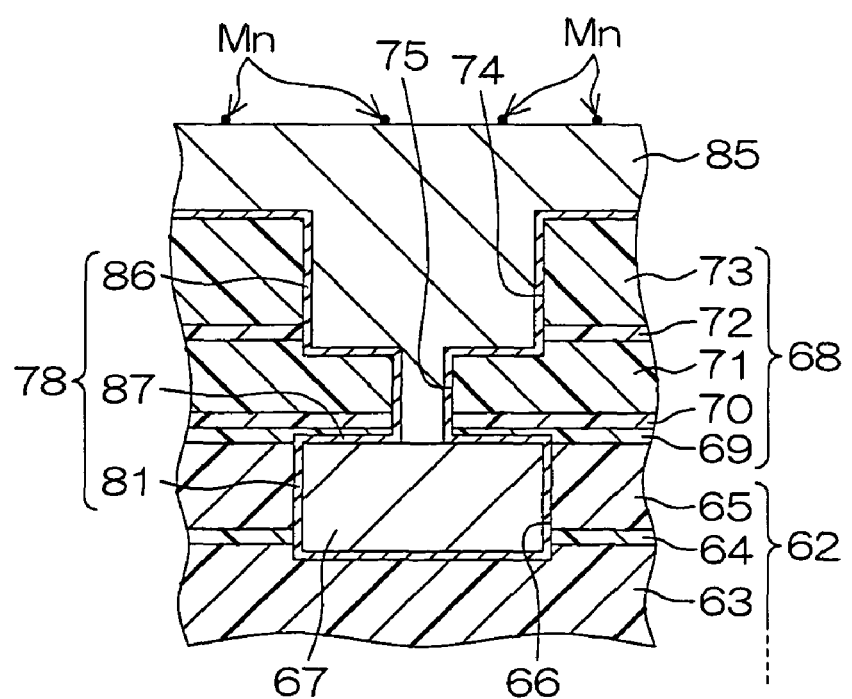
FIG. 5L is a schematic sectional view showing a step subsequent to FIG. 5K.
Figure 6:
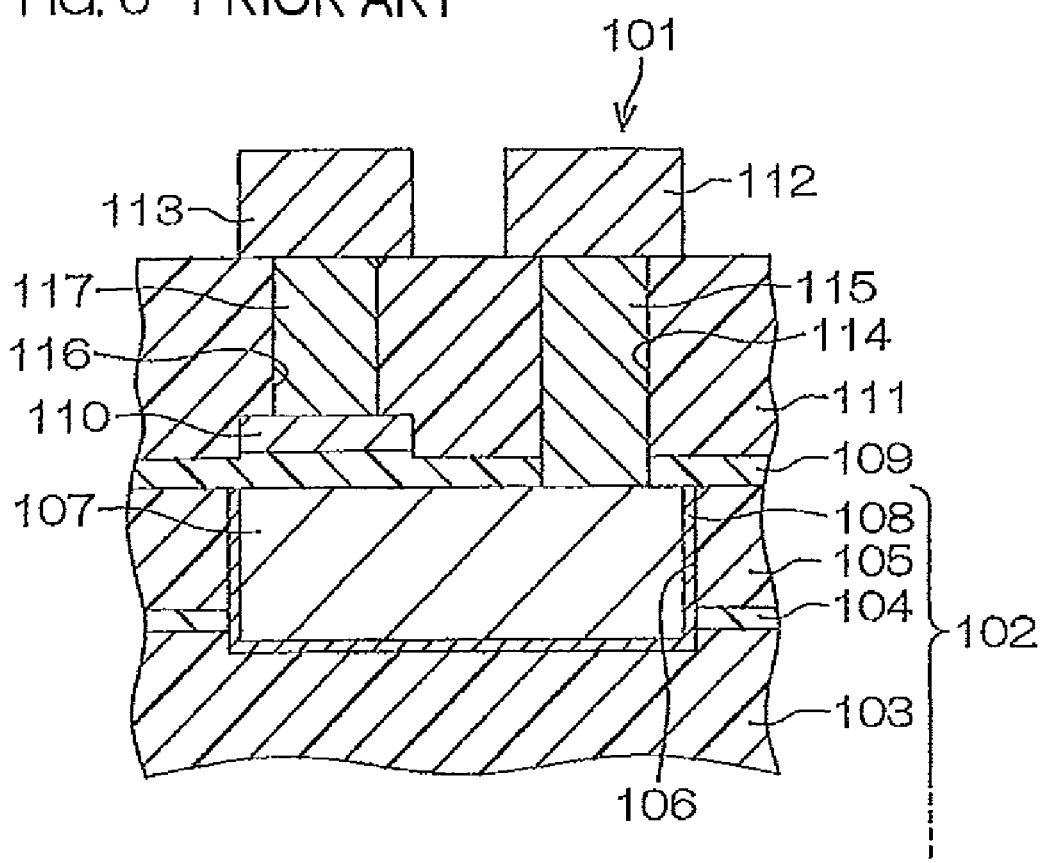
FIG. 6 is a schematic sectional view of a conventional semiconductor device including a MIM capacitance element.
Figure 7:
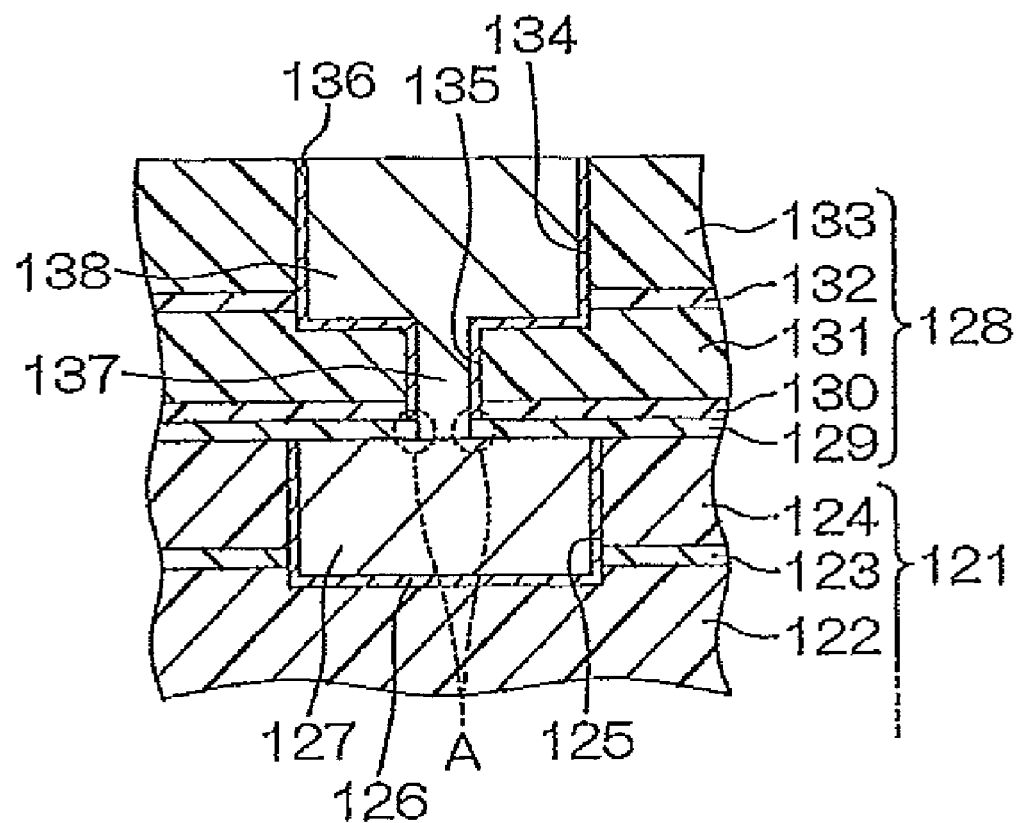
FIG. 7 is a schematic sectional view of a conventional semiconductor device having a multilayer interconnection structure.

Thereafter a heat treatment is so performed that Mn in the alloy film 84 combines with Si and O contained in the second insulating layer 68 and an MnSiO film 86 is formed, as shown in FIG. 5L. Further, Mn having remained in the first wire 67 combines with Si and O contained in the interlayer film 69, and an MnSiO film 87 is formed. Thus, the barrier film 78 consisting of the MnSiO films 81, 86 and 87 is formed between the first wire 67 and each of the first insulating layer 62 and the second insulating layer 68 and between the second insulating film 68 and each of the second wire 76 and the via 77. Following the formation of the barrier film 78, the alloy film 84 is generally integrated with the metallic material layer 85.

Then, the metallic material layer 85 and the barrier film 78 are polished by CMP. The polishing is continued until unnecessary portions of the metallic material layer 85 and the barrier film 78 formed outside the second groove 78 are entirely removed, the surface of the second insulating layer 68 located outside the second groove 74 is exposed, and the surface of the second insulating layer 68 and the surface of the metallic material layer 85 in the second groove 74 are flush with each other. Thus, the second wire 76 embedded in the second groove and the via 77 embedded in the via hole 75 are formed, and the semiconductor device 61 shown in FIG. 4 is obtained.

In the semiconductor device 61, the first wire 67 made of the metallic material mainly composed of Cu is embedded in the first groove 66 formed in the first insulating layer 62. The second insulating layer 68 is stacked on the first insulating layer 62. The second wire 76 mainly composed of Cu is embedded in the second groove 74 formed in the second insulating layer 68. The first wire 67 and the second wire 76 are electrically connected with each other by the via 77 provided to penetrate the second insulating layer 68 on a portion where the same are opposed to each other. The barrier film 78 of MnSiO is continuously formed between the first wire 67 and each of the first insulating layer 62 and the second insulating layer 68 and between the second insulating film 68 and each of the second wire 76 and the via 77.

The barrier film 78 can prevent Cu contained in the first wire 67, the second wire 76 and the via 77 from diffusing into the first insulating layer 62 and the second insulating layer 68. Thus, occurrence of interwire leakage resulting from diffusion of Cu can be prevented.

The bottom portion (the lower end portion) of the via 77 is covered with and protected by the barrier film 78, whereby occurrence of stress migration around the bottom portion of the via 77 can be prevented when external force is applied to the semiconductor device 61. Consequently, wiring reliability can be improved.

According to the manufacturing method shown in FIGS. 5A to 5L, the heat treatment for forming the MnSiO film 81 between the first insulating layer 62 and the first wire 67 and the heat treatment for forming the MnSiO films 86 and 87 between the second insulating layer 68 and the first wire 67, the via 77 and the second wire 76 are dividedly performed in two steps. However, the MnSiO films 81, 86 and 87 may be formed through a single heat treatment step. In other words, the second insulating layer 68 is stacked without performing the heat treatment after the metallic material layer 80 is deposited. The barrier film 78 (the MnSiO films 81, 86 and 87) of MnSiO may be formed between the first wire 67 and each of the first insulating layer 62 and the second insulating layer 68 and between the second insulating layer 68 and each of the second wire 76 and the via 77 through the same step by carrying out the step and performing the heat treatment after stacking the metallic material layer 85.

While $SiO_2$ has been illustrated as the material for the interlayer film 69, the material for the interlayer film 69 may simply be an insulating material containing Si and O, and SiOC (carbon-doped silicon oxide) may be employed, for example.

This application corresponds to Japanese Patent Application No. 2007-165540 and Japanese Patent Application No. 2007-165541 filed with the Japan Patent Office on Jun. 22, 2007, the disclosures of which are incorporated herein by reference.

The invention claimed is:

1. A semiconductor device comprising:
a first insulating layer made of a material containing Si and O;
a lower groove shaped by digging down the first insulating layer;
a lower electrode, embedded in the lower groove, made of a metallic material mainly composed of Cu;
an insulating film, stacked on the lower electrode, in which at least a lowermost layer portion on the side of the lower electrode is made of $S_iO_2$;
an upper electrode, provided to be opposed to the lower electrode across the insulating film, made of a conductive material;
a first barrier film, formed between the lower electrode and each of the first insulating layer and the insulating film, made of $Mn_xSi_yO_z$, x, y and z being numbers greater than zero;
a W plug, provided to penetrate the insulating film and electrically connected to the lower electrode, made of W; and
a multilayer barrier film interposed between the W plug and the lower electrode and the insulating film, wherein the multilayer barrier film includes a Ta film in contact with the lower electrode and the insulating film and a TiN film in contact with the W plug.

2. A semiconductor device comprising:
a first insulating layer made of a material containing Si and O;
a lower groove shaped by digging down the first insulating layer;
a lower electrode, embedded in the lower groove, made of a metallic material mainly composed of Cu;
an insulating film, stacked on the lower electrode, in which at least a lowermost layer portion on the side of the lower electrode is made of $S_iO_2$;
an upper electrode, provided to be opposed to the lower electrode across the insulating film and insulated from the lower electrode by the insulating film, made of a conductive material;
a first barrier film, formed between the lower electrode and each of the first insulating layer and the insulating film, made of $Mn_xSi_yO_z$, x, y and z being numbers greater than zero;
a second insulating layer, stacked on the insulating film and the upper electrode, made of a material containing Si and O;
an upper groove shaped by digging down the second insulating layer;
a wire, embedded in the upper groove, made of a metallic material mainly composed of Cu;
a via, provided to penetrate the insulating film and the second insulating layer on a portion where the lower electrode and the wire are opposed to each other, made of Cu; and
a second barrier film, formed between the wire and the second insulating layer and between the via and each of the insulating film and the second insulating layer continuously with the first barrier film, made of $Mn_xSi_yO_z$, x, y and z being numbers greater than zero.

3. A semiconductor device comprising:
a first insulating layer made of a material containing Si and O;
a first groove shaped by digging down the first insulating layer;
a first wire, embedded in the first groove, made of a metallic material mainly composed of Cu;
a second insulating layer, stacked on the first insulating layer and the first wire, made of a material containing Si and O;
a second groove shaped by digging down the second insulating layer;
a second wire, embedded in the second groove, made of a metallic material mainly composed of Cu;
a via, provided to penetrate the second insulating layer on a portion where the first wire and the second wire are opposed to each other, made of Cu; and
a barrier film, continuously formed between the first wire and each of the first insulating layer and the second insulating layer and between the second insulating layer and each of the second wire and the via, made of $Mn_xSi_yO_z$, x, y and z being numbers greater than zero.

4. The semiconductor device according to claim 3, wherein the second insulating layer has an interlayer film made of $SiO_2$ on the lowermost layer adjacent to the first insulating layer.

5. The semiconductor device according to claim 2, wherein the wire and the via are integrally connected with each other.

6. The semiconductor device according to claim 3, wherein the second wire and the via are integrally connected with each other.

* * * * *

UNITED STATES PATENT AND TRADEMARK OFFICE
CERTIFICATE OF CORRECTION

PATENT NO.        : 8,102,051 B2
APPLICATION NO.   : 12/452235
DATED             : January 24, 2012
INVENTOR(S)       : Yuichi Nakao It is certified that error appears in the above-identified patent and that said Letters Patent is hereby corrected as shown below:

Title Page, Item 74 (Attorney, Agent, or Firm)

"Robin & Berdo, PC" should be changed to --Rabin & Berdo, P.C.--

Signed and Sealed this
Eighteenth Day of December, 2012

David J. Kappos
*Director of the United States Patent and Trademark Office*